(12) United States Patent
Mung et al.

(10) Patent No.: US 8,717,117 B2
(45) Date of Patent: May 6, 2014

(54) WIDEBAND ACTIVE QUASI-CIRCULATOR

(75) Inventors: Steve Wai Yin Mung, Hong Kong (CN); Wing Shing Chan, Hong Kong (CN)

(73) Assignee: City University of Hong Kong, Kowloon (HK)

( * ) Notice: Subject to any disclaimer, the term of this patent is extended or adjusted under 35 U.S.C. 154(b) by 451 days.

(21) Appl. No.: 13/097,583

(22) Filed: Apr. 29, 2011

(65) Prior Publication Data

US 2012/0274425 A1    Nov. 1, 2012

(51) Int. Cl.
*H03H 2/00* (2006.01)
*H01P 5/12* (2006.01)

(52) U.S. Cl.
USPC ........................................ 333/24 R; 333/100

(58) Field of Classification Search
USPC ............ 333/24 R, 1, 1.1, 117, 118, 120, 127, 333/213, 214, 215, 100
See application file for complete search history.

(56) References Cited

U.S. PATENT DOCUMENTS

| | | | |
|---|---|---|---|
| 4,947,136 A * | 8/1990 | Helms | 330/54 |
| 5,144,266 A | 9/1992 | Dougherty et al. | |
| 7,541,890 B2 | 6/2009 | Cheung et al. | |
| 7,801,493 B2 | 9/2010 | Do | |

OTHER PUBLICATIONS

Mung et al., Novel Active Quasi-Circulatior With Phase Compensation Technique, Dec. 2008, IEEE, vol. 18 No. 12, 3 pages.*
Bahri et al., Analysis and Design of New Active Quasi Circulator and Circulators, 2009, PIER 96, 377-395.*

* cited by examiner

*Primary Examiner* — Dean O Takaoka
(74) *Attorney, Agent, or Firm* — Amin, Turocy & Watson, LLP

(57) ABSTRACT

Aspects describe a wideband active quasi-circulator that has the advantages of small size, lightweight, and compatibility with monolithic microwave integrated circuit (MMIC) technology. An active quasi-circulator is provided that comprises both a power amplifier and a low noise amplifier. The active quasi-circulator can operate over a wide frequency range with isolation or substantial isolation between a power amplifier and a low noise amplifier that is tunable with isolation or substantial isolation at any frequency within the wide frequency range. The provided quasi-circulator is suitable for use in mobile units in multi-band radio frequency communication systems, as well as in other configurations.

19 Claims, 16 Drawing Sheets

WIDEBAND ACTIVE QUASI-CIRCULATOR

TECHNICAL FIELD

The subject disclosure relates to circulators and, more particularly, to a wideband active quasi-circulator for use in radio frequency applications.

BACKGROUND

Wireless communications have become prevalent in society. With such widespread use, it is desirable to design communication devices that are lightweight, have a small footprint with a minimum amount of internal components, and that are cost effective to produce, resulting in devices that are inexpensive and easy for the consumer to carry.

To reduce the size of such communication devices, it is desirable to maintain continuous (or almost continuous) bi-directional data transfer between two (or more) devices that are in communication with each other (e.g., full duplex operation). For full duplex operation, a device might utilize frequency diversity where the device transmits on a first frequency range (or band) and receives on a second frequency range (or band). The frequencies used can be separated by an adequate guard-band so that frequency-selective filters can be used to isolate the receiver from the transmitter while, at the same time, coupling both the receiver and the transmitter to a common antenna (also referred to as frequency diplexing). Other techniques utilized to separate the transmit signals from the receive signals for full duplex operation, over a single antenna, include time diversity techniques, spread spectrum codes, polarization selectivity, and circulators.

An issue associated with wireless communications relates to co-site interference wherein communications from devices within a geographic region interfere with other devices in the same geographic region. A solution for co-site interference issues is the quasi-circulator. However, a problem with conventional circulators and quasi-circulators is that such devices can be bulky and can have a narrow frequency range and thus, are not practical in use. Even if the circulator has a small size and a wideband frequency range, a problem that arises is that there might not be enough isolation between ports of the circulator. Another problem can be a circulator that has a narrow tuning range and thus, has a limited tuning bandwidth.

Additionally, conventional communication devices utilize a multitude of internal components. For example, radio frequency (RF) devices utilize power amplifiers, low noise amplifiers, switchplexer, and discrete components. These internal components increase the cost for RF-front end and can also increase the size (and weight) of communications devices.

The above-described deficiencies of today's radio frequency device architectures are merely intended to provide an overview of some of the problems of conventional systems, and are not intended to be exhaustive. Other problems with conventional systems and corresponding benefits of the various non-limiting embodiments described herein may become further apparent upon review of the following description.

SUMMARY

A simplified summary is provided herein to help enable a basic or general understanding of various aspects of exemplary, non-limiting embodiments that follow in the more detailed description and the accompanying drawings. This summary is not intended, however, as an extensive or exhaustive overview. Instead, the sole purpose of this summary is to present some concepts related to some exemplary non-limiting embodiments in a simplified form as a prelude to the more detailed description of the various embodiments that follow.

In accordance with one or more aspects and corresponding disclosure thereof, various aspects are described in connection with an active quasi-circulator that has a small size, is lightweight, and can be compatible with monolithic microwave integrated circuit (MMIC) technology and, therefore, can replace a bulky ferrite circulator. Such replacement can be transparent to the changing standards including the Radio Frequency (RF) architecture referred to as software defined radio.

In an aspect, the active-circulator comprises both a power amplifier and a low noise amplifier, which are constructed by distributed amplifiers. A fundamental block of the active-circulator is distributed amplifiers, therefore, different topologies to improve the performance of distributed amplifiers can be implemented in the quasi-circulator, which can provide good power handling and noise figure performance.

The quasi-circulator, as disclosed herein, can operate over a wide frequency range with isolation (or substantial isolation) between the power amplifier and the low noise amplifier that is tunable (or reconfigurable) with high isolation at any frequency within the wide frequency range. Further, the disclosed quasi-circulator is suitable for use in mobile units in multi-band radio frequency communication systems. In addition, the disclosed quasi-circulator can replace a conventional passive switchplexer, which can further reduce the size of the circuit.

These and other embodiments are described in more detail below.

BRIEF DESCRIPTION OF THE DRAWINGS

Various non-limiting embodiments are further described with reference to the accompanying drawings in which.

DETAILED DESCRIPTION

Wireless communications standards utilize several frequency bands that can be spread over a large range (e.g., Global System for Mobile Communications (GSM), WiFi, Global Positioning System (GPS), Bluetooth, and so forth). Due to global roaming, it has become necessary to utilize wideband Radio Frequency (RF) front-end circuits to support different global standards (and associated frequency bands).

Figure 1:
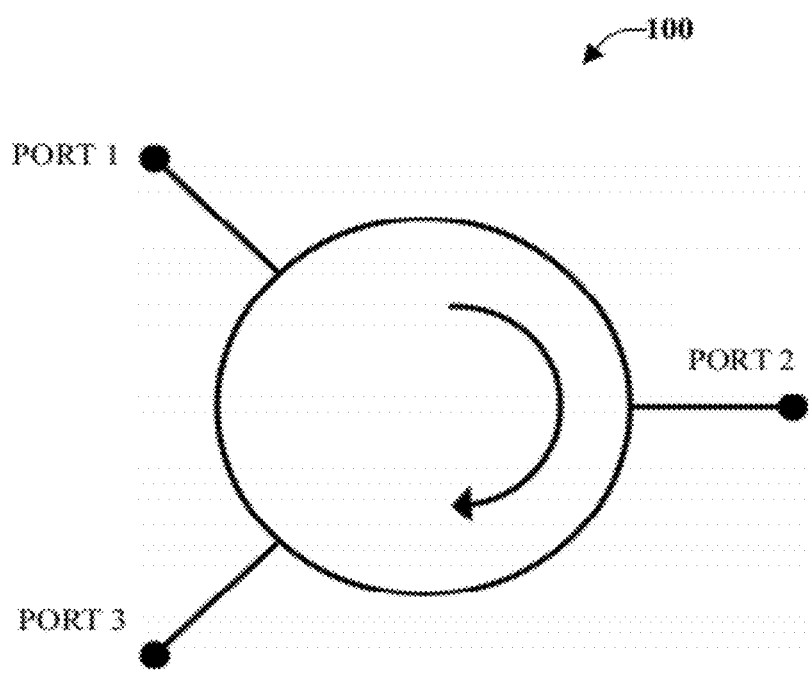
FIG. 1 illustrates an example of a conventional circulator.

A circulator is a device comprising ports arranged such that energy entering one port is coupled to an adjacent port, but is not coupled to other ports. An example of a conventional circulator 100 comprising three-ports is illustrated in FIG. 1. The ports, labeled as Port 1, Port 2, and Port 3 ($S_{13}$=0) are arranged such that energy entering Port 1 is coupled to Port 2 (an adjacent port), but is not coupled to Port 3. Thus, signals are input to Port 1 and passed to the next port (e.g. Port 2) in a certain rotation (e.g., clockwise direction) without allowing the signals to pass in the opposite rotation (e.g., counter-clockwise direction). Further, the signals are not transferred to Port 3 because Port 3 is isolated from Port 2. The properties of the conventional circulator can be seen in the S-parameter matrix below:

$$[S_{conventional}] = \begin{bmatrix} 0 & 0 & 1 \\ 1 & 0 & 0 \\ 0 & 1 & 0 \end{bmatrix} \qquad \text{S-parameter matrix 1}$$

It is noted that although the circulator illustrated in FIG. 1 is a three-port device with a clockwise rotation, the disclosed aspects can be utilized with circulators having a different number of ports and/or a different rotation (e.g., counter-clockwise).

A function of a circulator is to provide non-reciprocal characteristics (e.g., provides one direction transmission) to enable isolation (or substantial isolation) between ports of the circulator. When used as an isolator, the circulator has one port terminated in a matched load. A two-port isolator is non-reciprocal and provides isolation for the reverse direction only.

Conventional circulators of various types have known problems. For example, ferrites are a traditional material used for conventional passive circulators. The use of such circulators is based on Faraday rotation, which occurs when microwaves of a specific polarization are incident upon a ferrite material that is subjected to a magnetic field parallel to the direction of propagation of the microwaves. Circulators composites of ferrites are bulky, weighty, and have a narrow frequency range. Therefore, such circulators are generally impractical.

Figure 2:
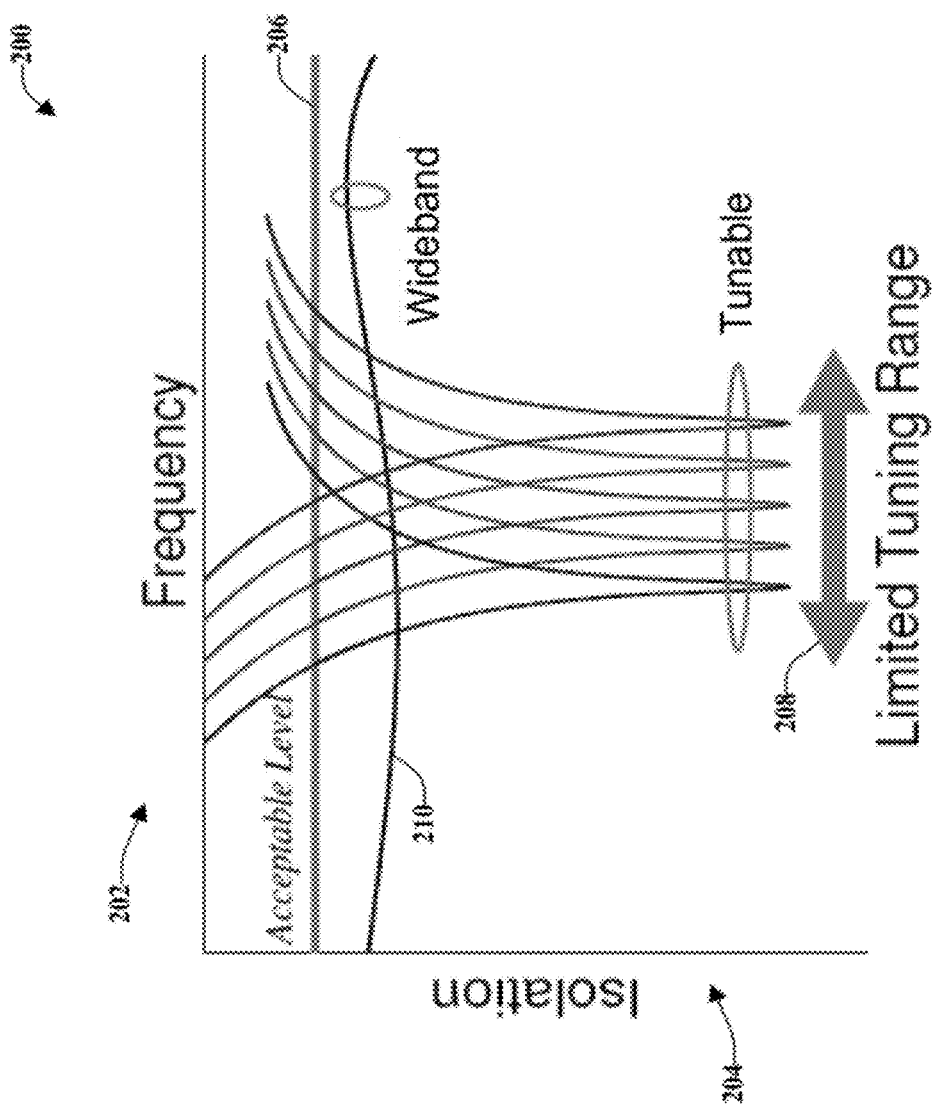
FIG. 2 illustrates a chart of a limited tuning range of a conventional wideband and tunable active circulator.

A tunable (or reconfigurable) active circulator is an active/passive device that has a narrow tuning range. An advantage of a tunable active circulator is small size as compared with conventional circulators. However, a problem associated with the tunable active circulator is a limited tuning bandwidth. A chart 200 of a limited tuning range of a conventional wideband and tunable active circulator is shown in FIG. 2 where frequency 202 is represented along the horizontal axis and isolation 204 is represented along the vertical axis. An acceptable level of isolation is illustrated by the dashed line 206. As shown by the arrow 208, there is a limited tuning range available with a tunable active circulator. Also shown is a conventional wideband active quasi-circulator frequency response 210.

In RF/microwave systems, non-reciprocal components, such as isolators and circulators, provide isolation between ports in both time and frequency. A conventional ferrite circulator can be replaced by an active circulator or a quasi-circulator. An active quasi-circulator is not a complete active circulator, but is similar to the conventional circulator except there is no signal flow from Port 3 to Port 1. The properties of a quasi-circulator are provided in the S-parameter matrix below:

$$[S_{quasi}] = \begin{bmatrix} 0 & 0 & 0 \\ 1 & 0 & 0 \\ 0 & 1 & 0 \end{bmatrix} \qquad \text{S-parameter matrix 2}$$

An active quasi-circulator has some advantages as compared to conventional ferrite circulators. These advantages include small size, lightweight, and compatibility with monolithic microwave integrated circuit (MMIC) technology. Another advantage is that the active quasi-circulator can cover a wideband frequency range. Further, a signal transfer from Port 1 to Port 2 can be achieved with low insertion loss.

Circulators have various applications, including duplexing, multiplexing, and phase shifting. A duplexer is a device that switches an antenna to either a transmitter or a receiver. Thus, a single antenna can be utilized for both transmission and reception. When a circulator is used for duplexing, the circulator can allow for simultaneous (or almost simultaneous) signal transmission and reception at different frequencies. Thus, there is the need for good port isolation. If the circulator has a wideband frequency operation, the circulator can support multi-band standards at substantially the same time while utilizing a single antenna and a transmit/receive circuit. An application for such circulators is software defined radios which utilize wideband non-reciprocal components, which can allow for the transmission of both Time Division Multiple Access (TDMA) and Frequency Division Multiple Access (FDMA) without the need for diplexing filters and/or duplexing switches, thus mitigating the complexity of the circuit.

For multiplexing, a de-multiplexer device is utilized. The de-multiplexer comprises interconnected filters that can split a single channel carrying many frequencies into two or more channels that carry narrower bands of frequencies. A multiplexer can carry out an inverse process. For example, a multiplexer can combine into a single broadband channel two or more channels carrying different bands of frequencies. A two-channel multiplexer, referred to as a diplexer, typically comprises a low-pass filter and a high-pass filter. On the other hand, a multiplexer, comprising three or more channels, typically comprises band-pass filters.

Phase shifting can be accomplished with narrow-band phase shifters that can comprise microwave circulators. Such phase shifters offer simplicity, since only a reflective shifter is needed.

For wireless communications, RF/microwave circuits can support multi-band standards, such as GSM, 3G, 4G, GPS, WiFi, Bluetooth, and others. With the growth of mobile communications and a variety of different standards, the use of wideband active quasi-circulators can provide advantages over known techniques, such as circulators that use ferrite. The disclosed wideband active quasi-circulators have the advantages of small size, light weight, and compatibility with monolithic microwave integrated circuit (MMIC) technology as well as the ability to transmit and receive at substantially the same time and at different frequencies.

The software defined radio utilizes multimode operation and the disclosed aspects can be utilized with the software defined radio. Further, existing mobile units in a multi-band radio frequency communication system can utilize the disclosed aspects to replace a conventional passive switchplexer to further reduce the size of the mobile unit.

An aspect relates to a wideband active quasi-circulator comprising a first port, a second port, and a third port. The wideband active quasi-circulator also comprises a first distributed amplifier connected to the first port, the first distributed amplifier configured for wideband signal cancellation. Also included is a second distributed amplifier that can be configured as a wideband power amplifier. The second distributed amplifier is operatively connected to the first distributed amplifier. Further, the wideband active quasi-circulator comprises a third distributed amplifier configured as a wideband low noise amplifier. The third distributed amplifier is operatively connected to the first distributed amplifier, the second distributed amplifier, the second port, and the third port.

In an implementation, the wideband active quasi-circulator also comprises an antenna configured for simultaneous (or almost simultaneous) transmission and reception of a signal when the three distributed amplifiers are biased.

In another implementation, the second distributed amplifier and the third distributed amplifier are configured to provide wideband frequency operation.

In a further implementation, at a first frequency, the wideband power amplifier is isolated or substantially isolated from the wideband low noise amplifier.

In some implementations, the first port is a single antenna port. The single antenna port, the wideband power amplifier, and the wideband low noise amplifier are configured for simultaneous (or almost simultaneous) transmission and reception of a signal.

According to some implementations, the wideband active quasi-circulator is configured to operate in a wideband frequency range as a function of a cut-off frequency. According to other implementations, the wideband active quasi-circulator is configured to perform wideband transmission and reception as a function of a topology of the first distributed amplifier, the second distributed amplifier, and the third distributed amplifier. In further implementations, the wideband active quasi-circulator is configured to operate in a wideband isolation between transmission and reception as a function of a wideband signal cancellation of the third distributed amplifier.

In some implementations, the wideband active quasi-circulator is tunable as a function of biasing the first distributed amplifier, the second distributed amplifier, and the third distributed amplifier to an isolation or substantial isolation enhancement between the wideband power amplifier and the wideband low noise amplifier at a certain frequency within the wideband frequency range.

In an implementation, the wideband power amplifier comprises a distributed power amplifier. In another implementation, the wideband low noise amplifier comprises a distributed low noise amplifier. In some implementations, each distributed amplifier comprises a different gate voltage combination to provide tunable isolation.

Another aspect relates to a method that includes associating a first distributed amplifier with a first port. The first distributed amplifier provides wideband signal cancellation. The method also includes electrically connecting a second distributed amplifier with the first distributed amplifier and connecting a third distributed amplifier to the first distributed amplifier and the second distributed amplifier. The third distributed amplifier comprises a second port and a third port. Electrical signals arriving at the first port propagate along a first path or a second path to the third port.

In an implementation, placing the second distributed amplifier comprises configuring the second distributed amplifier as a wideband power amplifier. In some implementations, connecting the third distributed amplifier comprises configuring the third distributed amplifier as a wideband low noise amplifier.

In some implementations, the electrical signals comprise transmit signals and receive signals that are received at the first port at about the same time and propagate along the first path or the second path to the third port.

According to some implementations, the method also includes tuning a gate voltage to implement a corresponding variation of at least one intrinsic parameter. The at least one intrinsic parameter comprises at least one of a gate channel parasitic reactance, a drain channel parasitic reactance, a transconductance, a time constant, a gate channel image impendence, a drain channel image impedance, a gain error, or a phase error.

In a further implementation, the method comprises biasing the first distributed amplifier, the second distributed amplifier, and the third distributed amplifier to obtain isolation or substantial isolation at a frequency within a wideband frequency range.

Another aspect relates to a system comprising means for providing wideband signal cancellation and means for supplying wideband power amplification. The system also comprises means for obtaining wideband low noise amplification. The means for providing, the means for supplying, and the means for obtaining are electrically coupled. The system also comprises means for altering gate voltage combinations of the means for providing, the means for supplying, and the means for obtaining for tunable isolation enhancement.

In an implementation, the system further comprising means for at substantially the same time transmitting and receiving signals to separate transmit and receive path signals.

Herein, an overview of some of the embodiments for a wideband active quasi-circulator has been presented above. As a roadmap for what follows next, various exemplary, non-limiting embodiments and features for active quasi-circulators are described in more detail. Then, some non-limiting implementations and examples are given for additional illustration, followed by representative networks and environments in which such embodiments and/or features can be implemented.

Figure 3:
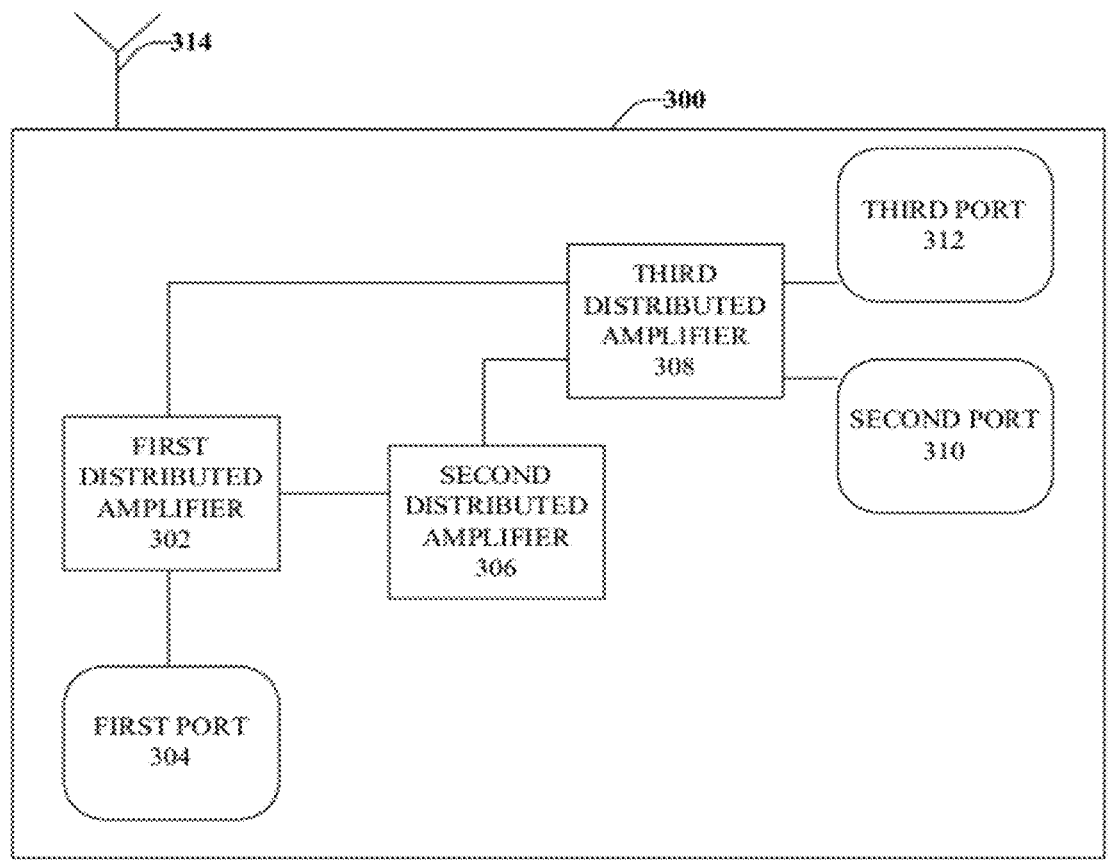
FIG. 3 illustrates a simple block diagram of a wideband active quasi-circulator, in accordance with an aspect.

FIG. 3 illustrates a simple block diagram of a wideband active quasi-circulator 300, in accordance with an aspect. The wideband active quasi-circulator 300 can by utilized in a variety of devices including, but not limited to, mobile phones based applications, such as laptops, portable E-books, and next mobile generation devices. Further, the topology of the disclosed aspects can replace the RF front end utilized with conventional devices. For example, lower costs for the RF-frond end can be realized by utilizing the disclosed aspects to replace the current separate power amplifier, low noise amplifier, switchplexer, and discrete components.

The wideband active quasi-circulator 300 comprises a first distributed amplifier 302 connected to a first port 304. The first distributed amplifier 302 can be configured for wideband signal cancellation, according to an aspect. A second distributed amplifier 306 is operatively connected to the first distributed amplifier 302.

The wideband active quasi-circulator 300 also comprises a third distributed amplifier 308 connected to the first distributed amplifier 302 and the second distributed amplifier 306. The third distributed amplifier 308 is also connected to a second port 310 and a third port 312.

The second distributed amplifier 306 and the third distributed amplifier 308 can be configured to provide wideband frequency operation. In an aspect, the second distributed amplifier 306 is configured as a wideband power amplifier and the third distributed amplifier 308 is configured as a wideband low noise amplifier.

At a first frequency, the wideband power amplifier can be isolated or substantially isolated from the wideband low noise amplifier, according to an aspect. The first frequency can be a particular frequency within a wideband frequency range.

In accordance with some aspects, the wideband active quasi-circulator 300 comprises an antenna 314 configured for simultaneous (or almost simultaneous) transmission and reception of a signal when the three distributed amplifiers 302, 306, 308 are biased. According to other aspects, the first port 304 is a single antenna port. The single antenna port, the wideband power amplifier, and the wideband low noise amplifier can be configured for simultaneous (or almost simultaneous) signal transmission and signal reception.

According to various aspects, the wideband active quasi-circulator 300 is configured to operate in a wideband frequency range as a function of a cut-off frequency. In some aspects, the wideband active quasi-circulator 300 is configured to perform wideband transmission and reception as a function of a topology of the first distributed amplifier 302, the second distributed amplifier 306, and the third distributed amplifier 308. In further aspects, the wideband active quasi-circulator 300 is configured to operate in a wideband isolation between transmission and reception as a function of a wideband signal cancellation of the third distributed amplifier 308.

The first distributed amplifier 302, the second distributed amplifier 306, and the third distributed amplifier 308 can be biased to achieve isolation or substantial isolation enhancement between the wideband power amplifier and the wideband low noise amplifier at a certain frequency within the wideband frequency range.

In accordance with some aspects, the wideband power amplifier comprises a distributed power amplifier. In other aspects, the wideband low noise amplifier comprises a distributed low noise amplifier.

A distributed amplifier is an amplifier that can provide a flat gain over a very wide frequency range. An advantage is that a distributed amplifier is a compact circuit that can be suitable for various wireless communications devices, including software defined radios.

Figure 4:
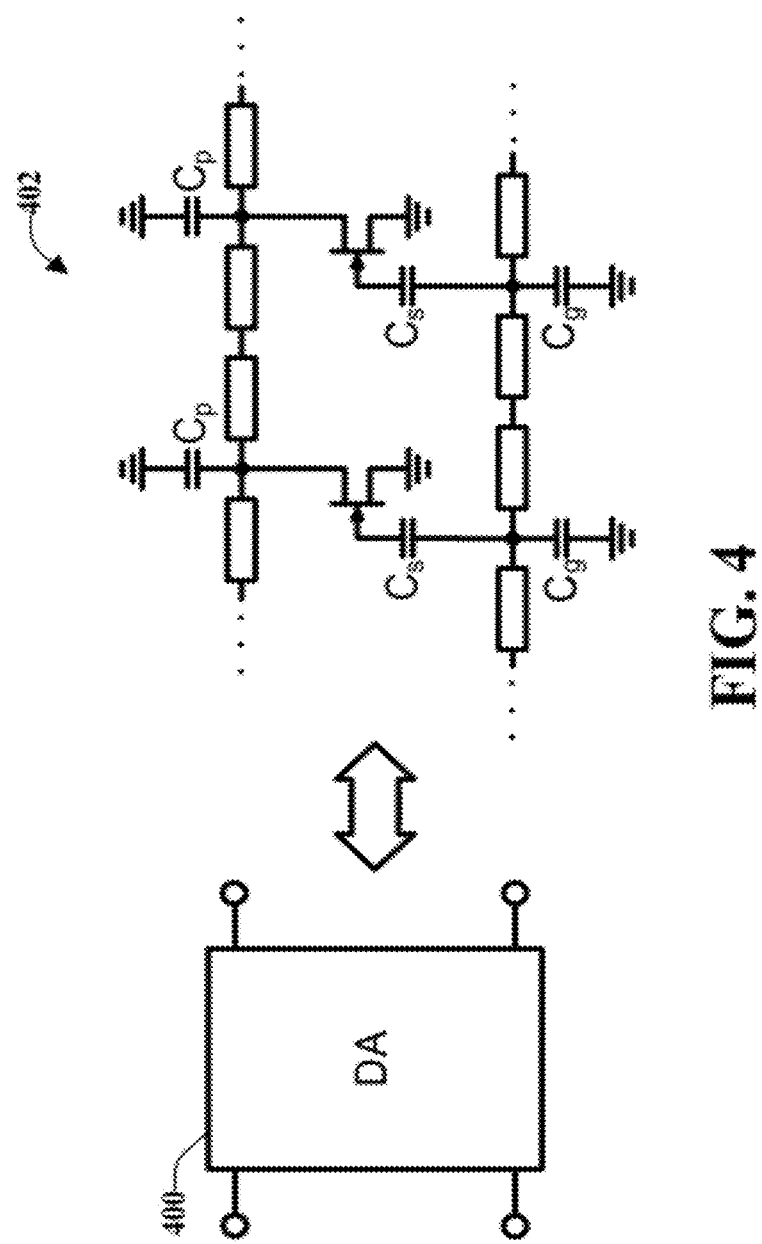
FIG. 4 illustrates an example distributed amplifier and circuit, according to an aspect.

In accordance with some aspects, an example distributed amplifier (DA) 400 and circuit 402 are illustrated in FIG. 4. A device commonly used in the design of distributed amplifiers is the field effect transistor (FET). However, a bipolar junction transistor (BJT) or another transistor can be utilized with distributed amplifiers. The following principles will be described for a distributed amplifier based on the FET. However, the principles can be applied to BJT or other transistors utilized for a distributed amplifier.

The circuit 402 design for the distributed amplifier 400 is a traditional amplifier design that incorporates artificial transmission line theory to obtain a larger gain-bandwidth than can be achieved by conventional circuits. Artificial transmission line is generally associated with negligible attenuation and, therefore, can be purely reactive. The artificial transmission line can be realized for a specified frequency range using lumped components, based on capacitors and inductors. The inductor represents the series conductor of an ideal transmission line while the capacitor represents the capacitance between the ideal transmission line conductor and ground.

As illustrated in the circuit 402, a series capacitor $C_s$ is added to each transistor gate input and a padding capacitor $C_p$ is added to the transistor drain unit, which can realize a unity gain. The gate channel and drain channel can have parasitic reactance $C_{gs}$ and $C_{ds}$ respectively. As shown by the circuit 402, the following equation (Equation 1) is satisfied:

$$C = \frac{C_s C_{gs}}{C_s + C_{gs}} + C_g = C_{ds} + C_p \qquad \text{Equation 1}$$

Figure 5:
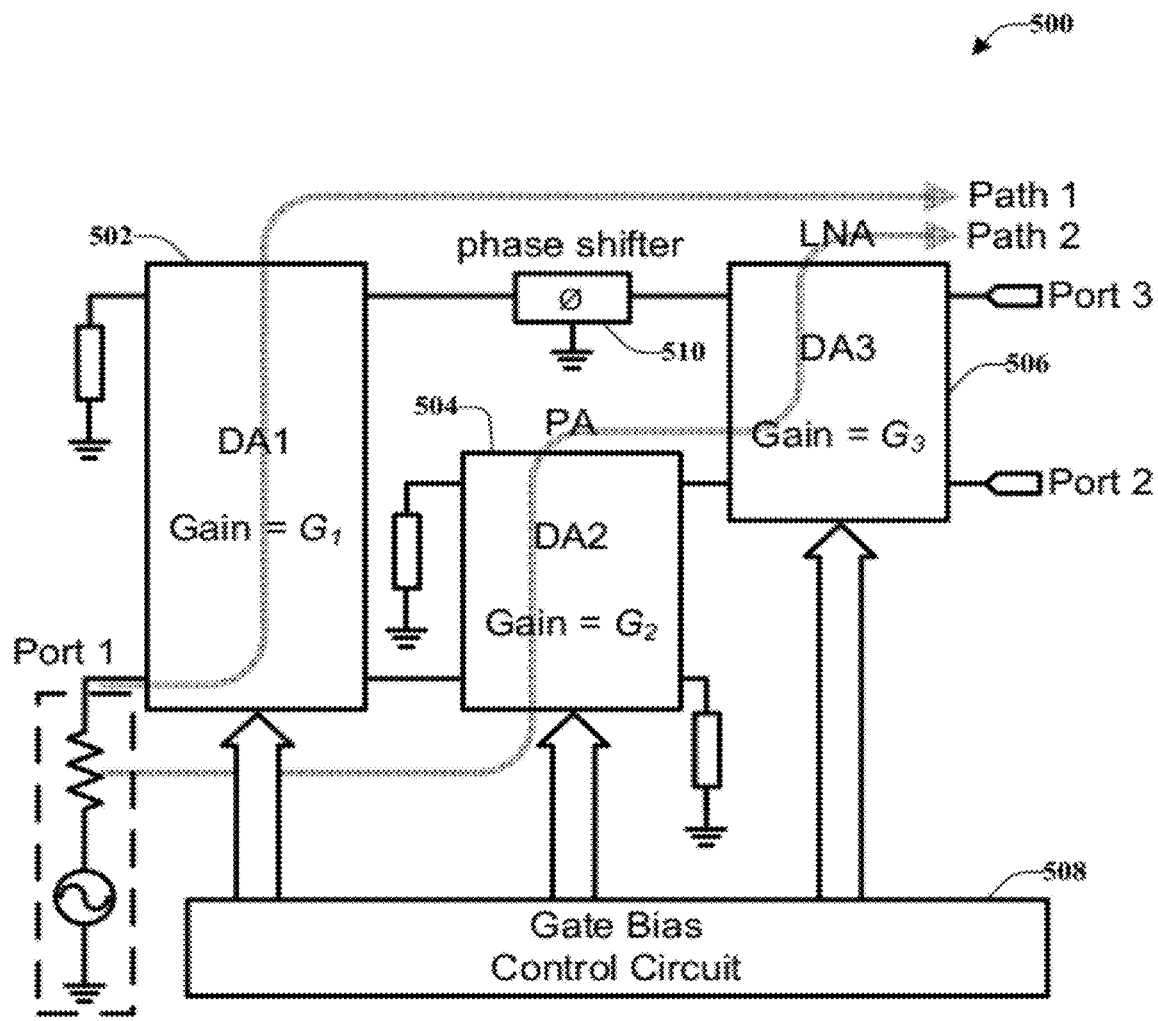
FIG. 5 illustrates a basic configuration of a wideband active quasi-circulator according to an aspect.

FIG. 5 illustrates a basic configuration of a wideband active quasi-circulator 500 according to an aspect. As shown, the wideband active quasi-circulator 500 comprises three ports, Port 1, Port 2, and Port 3. Also included are three distributed amplifiers, illustrated as first distributed amplifier 502, a second distributed amplifier 504, and a third distributed amplifier 506. Each distributed amplifier 502, 504, 506 is associated with a gain. For example, first distributed amplifier 502 has a first gain $G_1$, second distributed amplifier 504 has a second gain $G_2$, and third distributed amplifier 506 has a third gain $G_3$. Also included is a gate bias control circuit 508 operatively associated with the distributed amplifier 502, 504, and 506. Further, a phase shifter 510 can be operatively connected between the first distributed amplifier 502 and the third distributed amplifier 506.

In accordance with some aspects, the first distributed amplifier 502 is configured to provide wideband signal cancellation. The second distributed amplifier 504 and the third distributed amplifier 506 are configured to provide wideband transmission. In an aspect, the second distributed amplifier 504 is configured as a wideband power amplifier and the third distributed amplifier 506 is configured as a wideband low noise amplifier. Each of the distributed amplifiers can comprise the circuit 402 of FIG. 4.

A single antenna can allow simultaneous (or almost simultaneous) transmission and reception of signals from an antenna. These incoming signals from Port 1 have two paths propagating to Port 3, namely, Path 1 and Path 2. The two paths represent separate transmit and receive path signals. The separate paths can be achieved without the use of separated filters and, therefore, allows a single device to operate in multiple bands and can replace the separate block of devices (as utilized in conventional devices).

According to an aspect, the circuitry provides isolation (or substantial isolation) between Port 1 and Port 3 (S31). The isolation can be wideband isolation and/or tunable isolation. There is also unilateral property between other ports.

In accordance with some aspects, the distributed amplifier can act as a balun. A balun is a type of electrical transformer that can convert electrical signals that are balanced about ground (differential) to/from signals that are unbalanced (single-ended). Baluns are utilized in various devices, including balanced mixers, push-pull amplifiers, phase shifters, and so forth. Active baluns that utilize distributed amplifiers as a fundamental building block can provide good bandwidth performance without a large footprint (e.g., use a minimum amount of circuit area).

Figure 6:
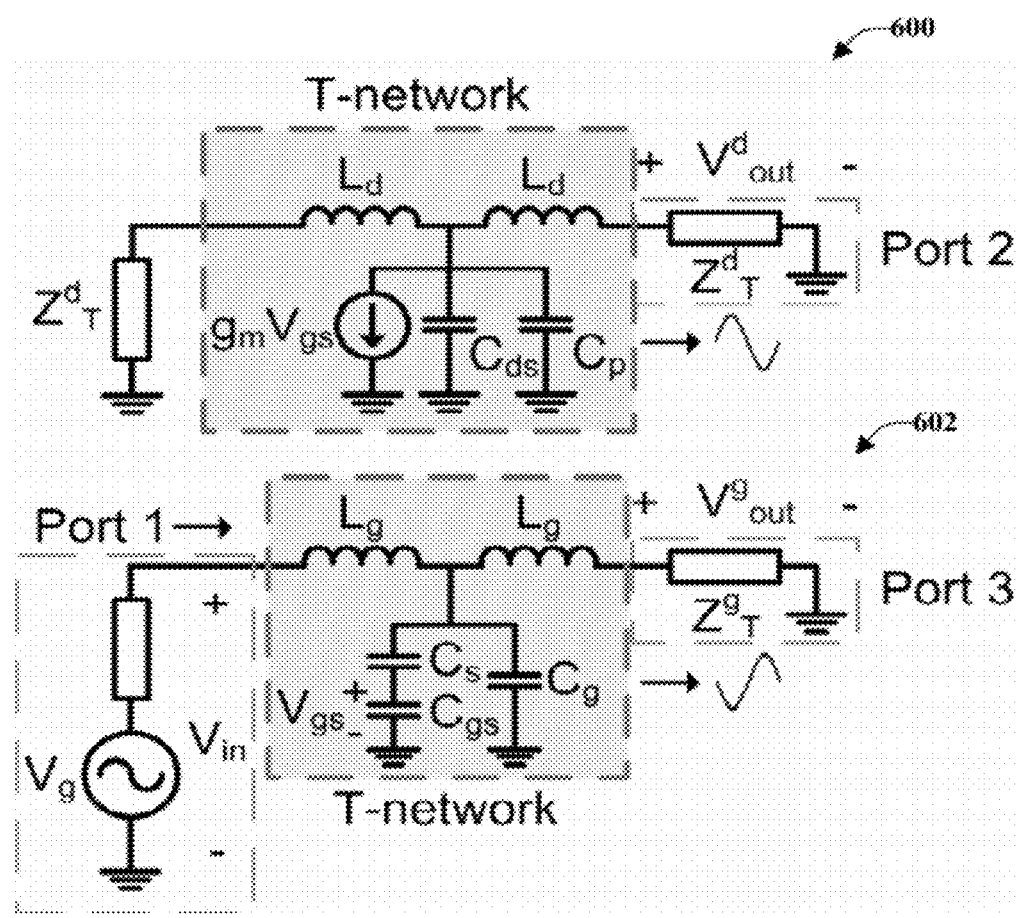
FIG. 6 illustrates circuits for wideband isolation, according to an aspect.

FIG. 6 illustrates circuits for wideband isolation, according to an aspect. Illustrated are a first circuit 600 and a second circuit 602. The circuits 600, 602 can be in a T-network. In operation, Path 1 and Path 2 (as shown in FIG. 5) is in anti-phase but have the same gain. For example, the first circuit 600 generates a first phase and the second circuit 602 generates a second phase. Further, there can be an inverting and non-inverting output in a distributed balun.

As illustrated, an image impedance $Z^d_T$ for the drain channel is at Port 2 (first circuit 600) and an image impedance $Z^g_T$ for the gate channel is at Port 3 (second circuit 602). As shown, the voltage divider established between $C_s$ and $C_{gs}$ yields an effective transconductance, such as:

$$g'_m = g_m \frac{C_s}{C_s + C_{gs}} \quad \text{Equation 2}$$

Figure 7:
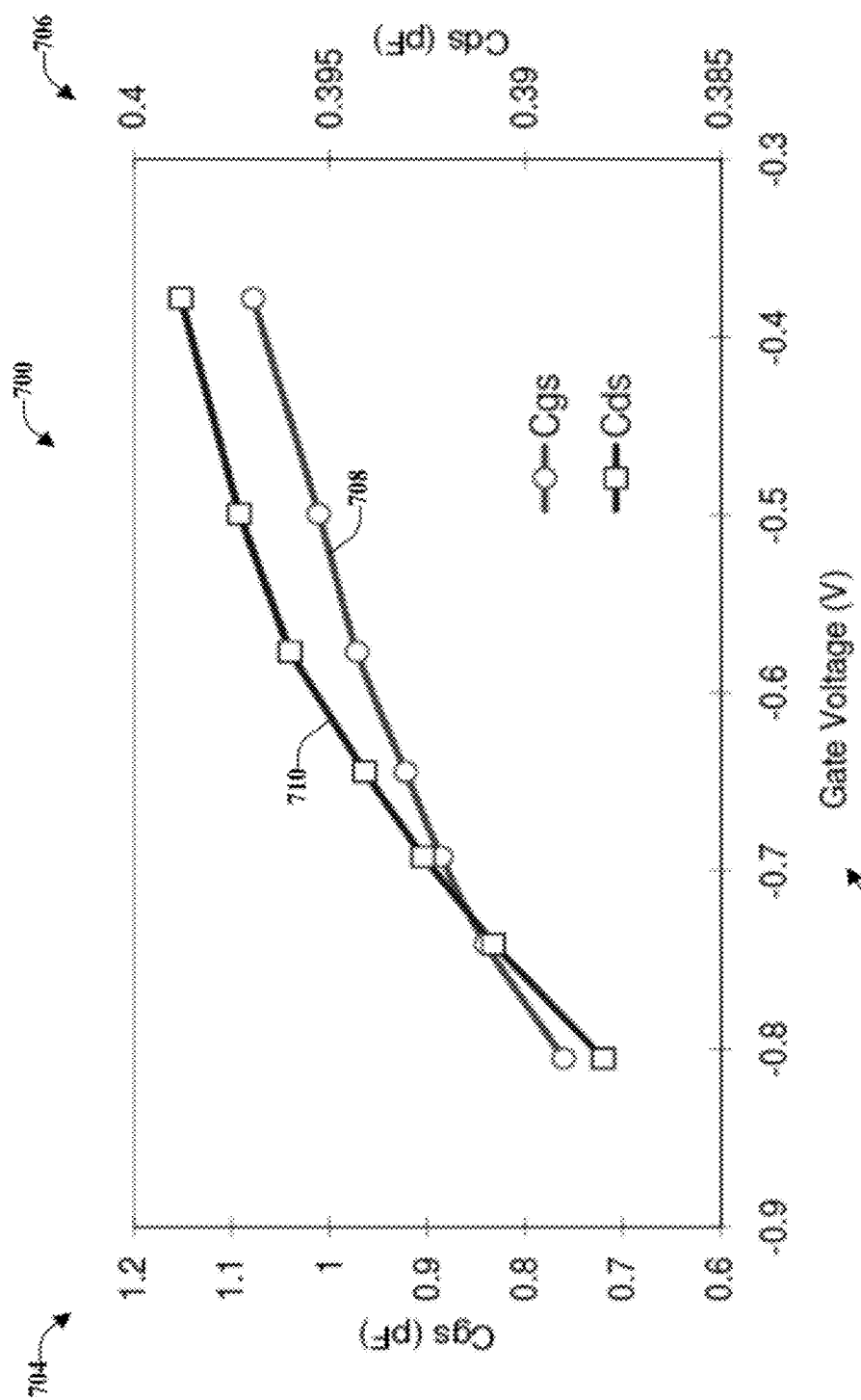
FIG. 7 is a chart illustrating some effects of gate voltage tuning, according to an aspect.

In accordance with some aspects, varying the gate voltage can vary the intrinsic parameters of the wideband active quasi-circulators. FIG. 7 is a chart 700 illustrating the effects of gate voltage tuning, according to an aspect. In the chart 700, gate voltage 702 is represented along the horizontal axis. The vertical axes represent gate channel parasitic reactance $C_{gs}$ 704, measured in picofarads (pF) and drain channel parasitic reactance $C_{ds}$ 706, measured in pF. Gate channel parasitic reactance $C_{gs}$ as a function of the gate voltage 702 is shown by line 708 and drain channel parasitic reactance $C_{ds}$ as a function of the gate voltage 702 is shown by line 710. As can be seen, an increase in gate voltage 702 results in a corresponding increase in the respective parasitic reactance of the gate channel and the drain channel, which provides tunable isolation.

Figure 8:
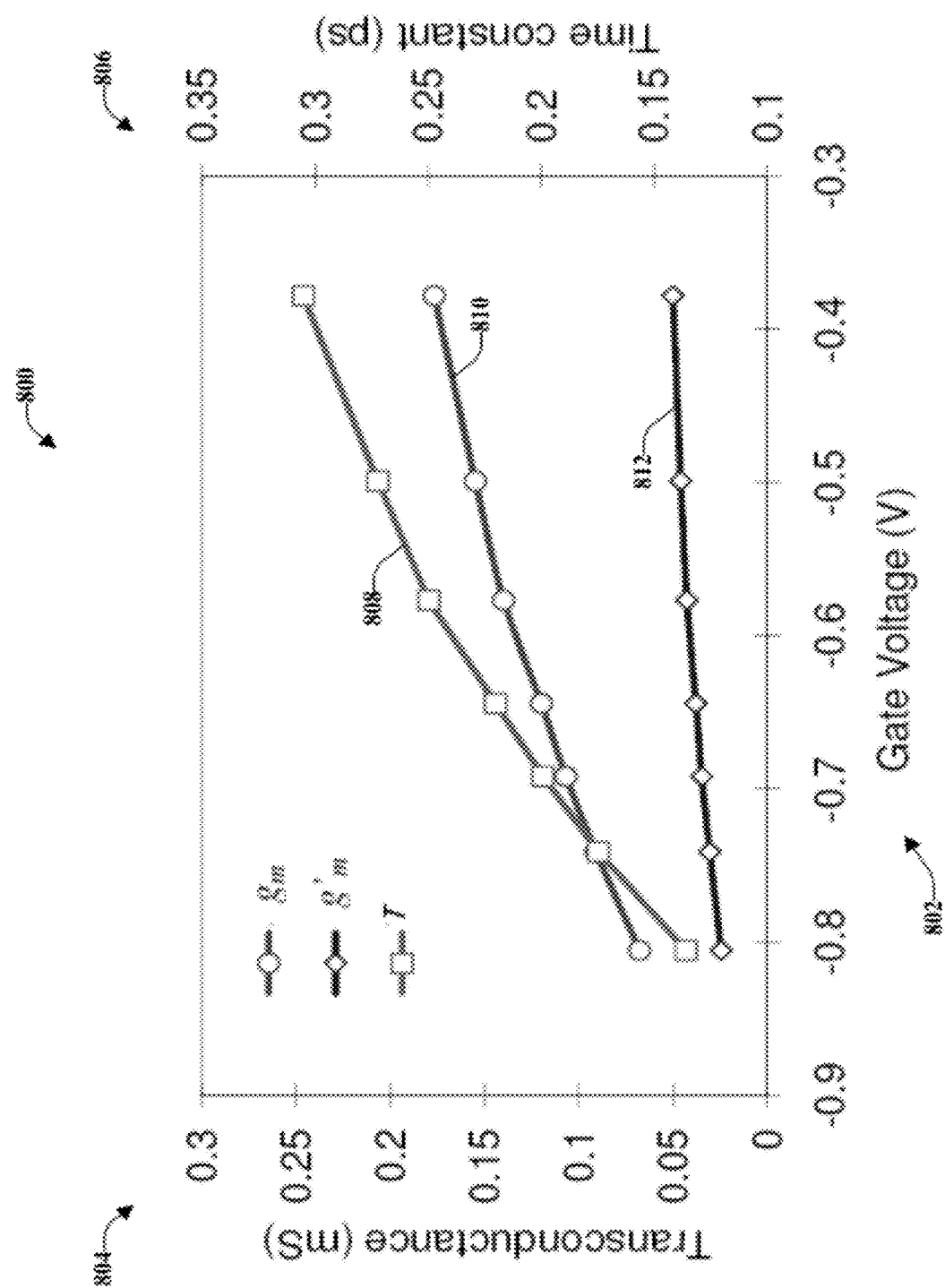
FIG. 8 is a chart illustrating another effect of gate voltage tuning, according to an aspect.

FIG. 8 is a chart 800 illustrating another effect of gate voltage tuning, according to an aspect. In the chart 800, gate voltage 802 is represented along the horizontal axis. The vertical axes represent transconductance 804, measured in Siemens (mS) and time constant 806, measured in picoseconds (ps). Transconductance $g_m$ is a voltage controlled current source that governs the magnitude of the current flowing through the device. The transconductance can be controlled by the voltage $V_{gs}$ across the input gate capacitance $C_{gs}$. Time constant as a function of the gate voltage 802 is shown by line 808. Transconductance as a function of gate voltage is shown at line 810 $g_m$ and line 812 $g'_m$. Thus, tuning of the gate voltage can vary one or more intrinsic parameters of the wideband active quasi-circulator.

Figure 9A:
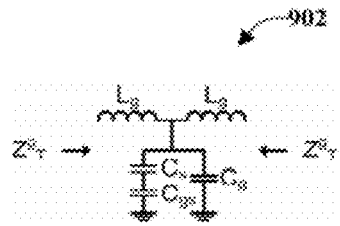
FIGS. 9A and 9B illustrate a simplified circuit and a chart for the image impedance for a drain channel.
Figure 9B:
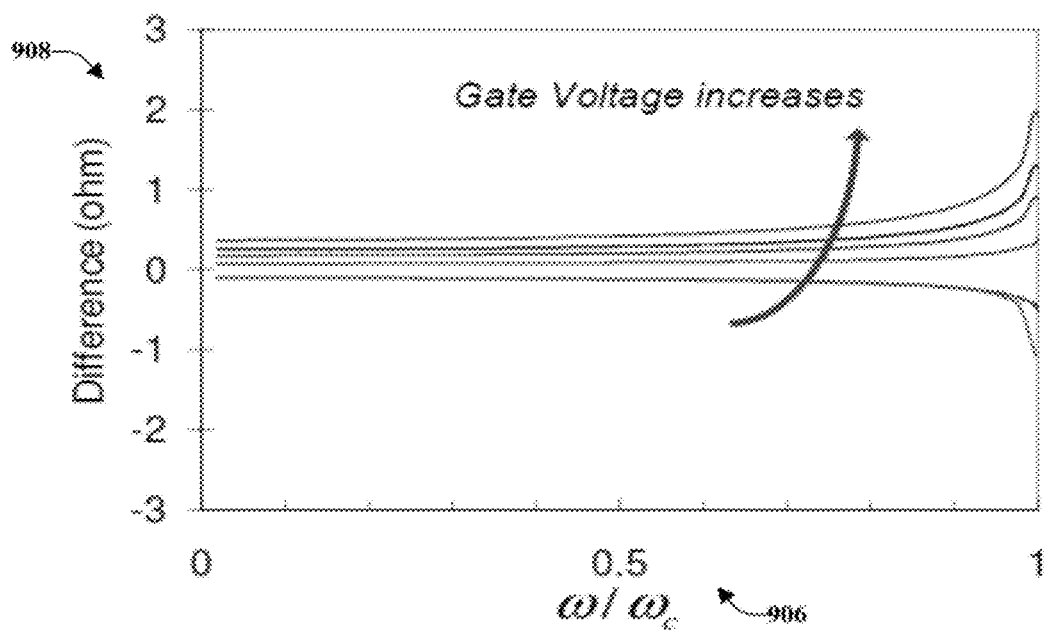

FIGS. 9A, 9B, 10A, and 10B illustrate how image impedances vary as a function of changes to the input gate voltages. FIG. 9A illustrates a simplified circuit 902, which is similar to second circuit 602 of FIG. 6. FIG. 9B illustrates a chart 904 for the image impedance $Z^g_T$ for the gate channel. As shown in the chart 904, the gate voltage increases as a function of an offset 906, represented on the horizontal axis, and a difference 908 (in ohms), represented on the vertical axis.

Figure 10A:
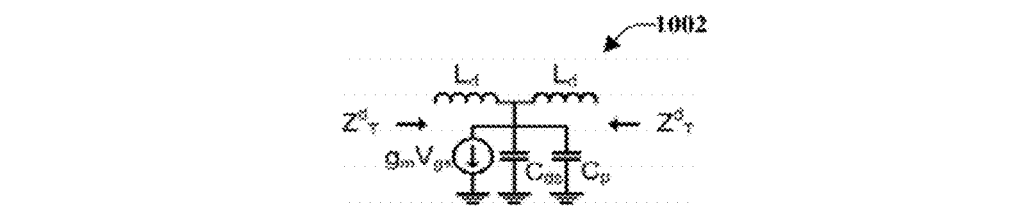
FIGS. 10A and 10B illustrate a simplified circuit and a chart for the image impedance for a gate channel.
Figure 10B:
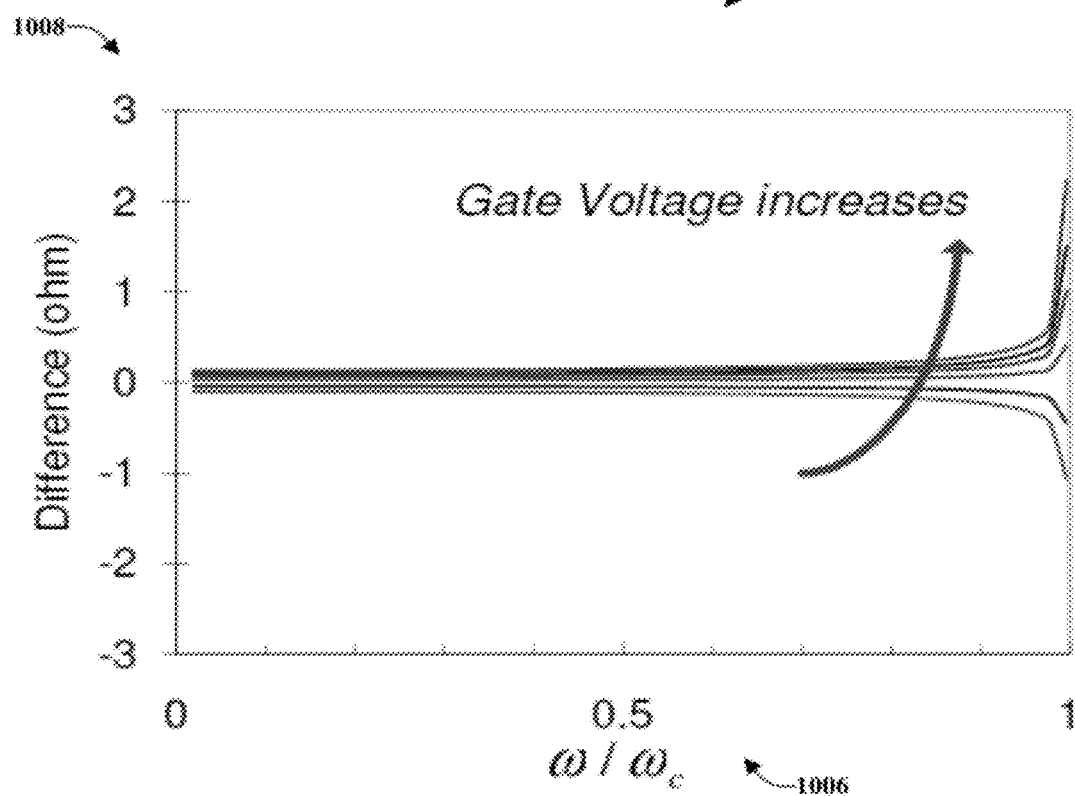

FIG. 10A illustrates a simplified circuit 1002, which is similar to first circuit 600 of FIG. 6. FIG. 10B illustrates a chart 1004 for the image impedance $Z^d_T$ for the drain channel. As shown in the chart 1004, the gate voltage increases as a function of an offset 1006, represented on the horizontal axis, and a difference 1008 (in ohms), represented on the vertical axis.

In accordance with some aspects, the power response of the signal stage distributed amplifier can vary with different gate voltages according to the equation below:

$$G_d = \frac{P_d}{P_i} = \frac{|g'_m|^2 \; |Z^g_T|^2 \; \|Z^g_\pi\| \; \|Z^d_\pi\| \; |\text{Re}(Z^d_T)| e^{-j(\beta_s + \beta_d)}}{4 \, |Z^d_T| \, \text{Re}(Z^g_T)} \quad \text{Equation 3}$$

Figure 11:
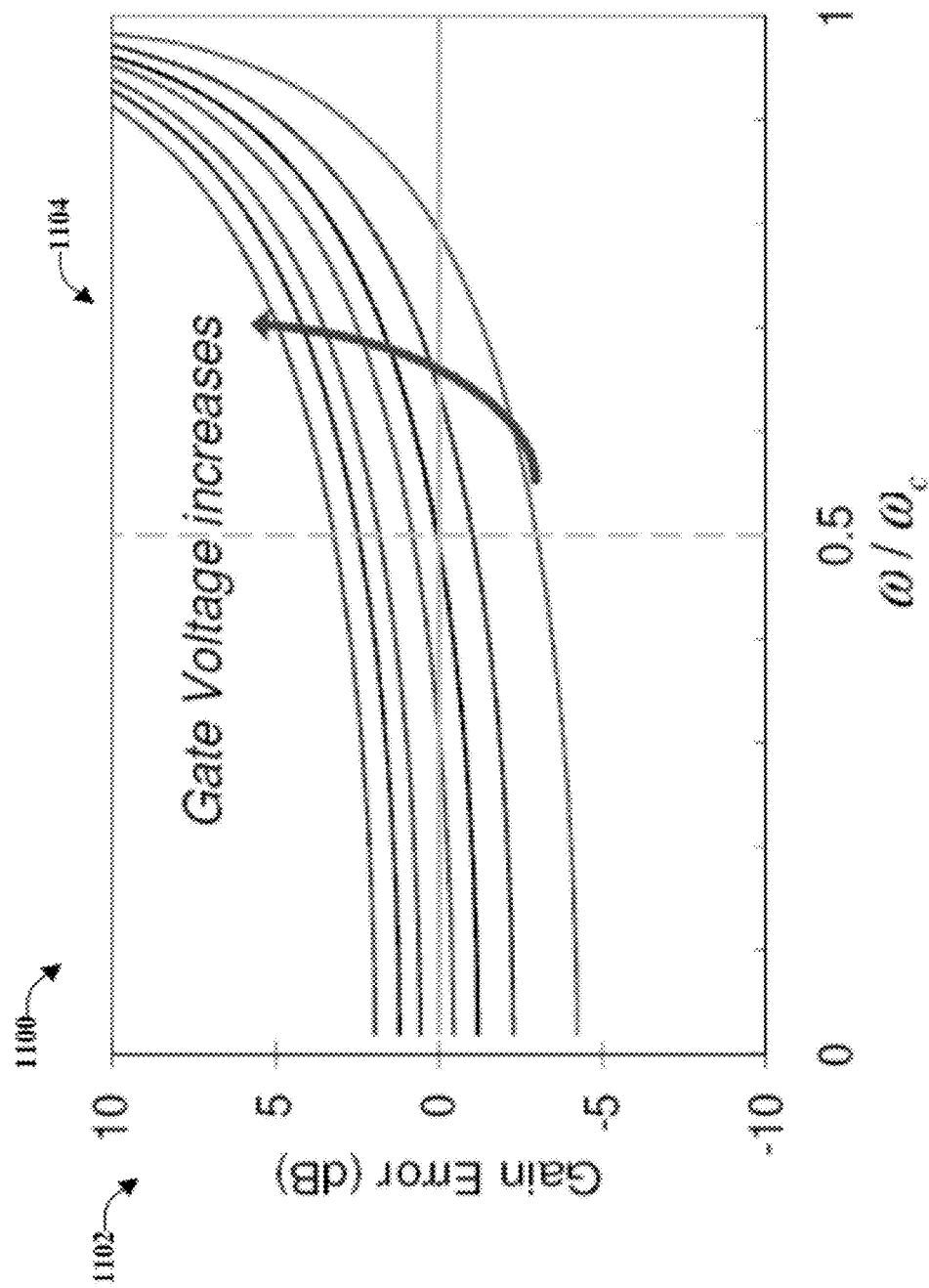
FIG. 11 illustrates a chart that represents a change in gain error as gate voltage increases, according to an aspect.
Figure 12:
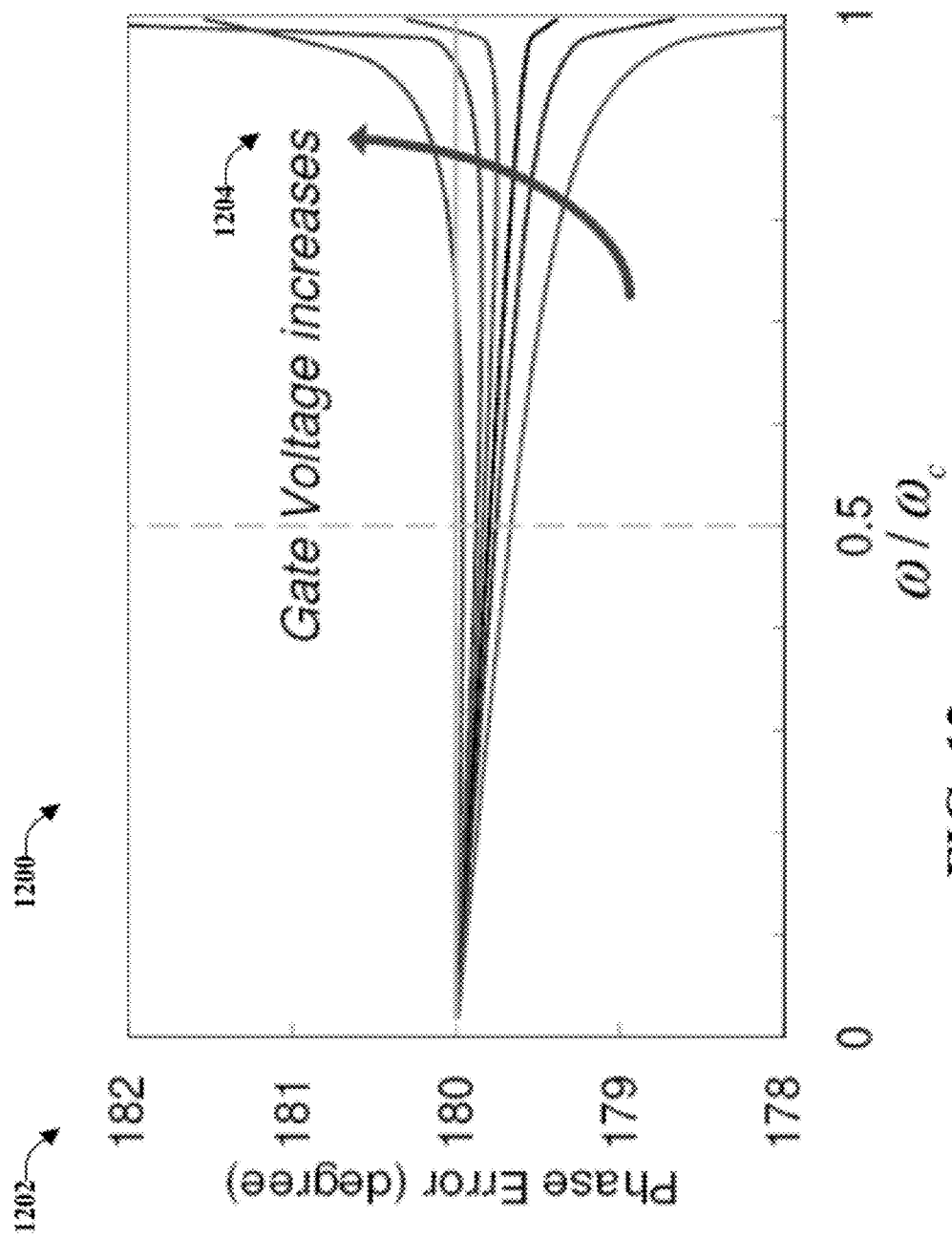
FIG. 12 illustrates a chart that represents a change in phase error as gate voltage increases, according to an aspect.

The power response is shown by the charts in FIGS. 11 and 12. FIG. 11 illustrates a chart 1100 that represents the change in gain error 1102, measured in dB, as gate voltage increases, represented at 1104. FIG. 12 illustrates a chart 1200 that represents a change in phase error 1202, measured in degrees, as gate voltage increases, represented at 1204. Thus, as illustrated in the charts 1100, 1200 the power response of the single stage distributed amplifier can vary with different gate voltages.

Figure 13:
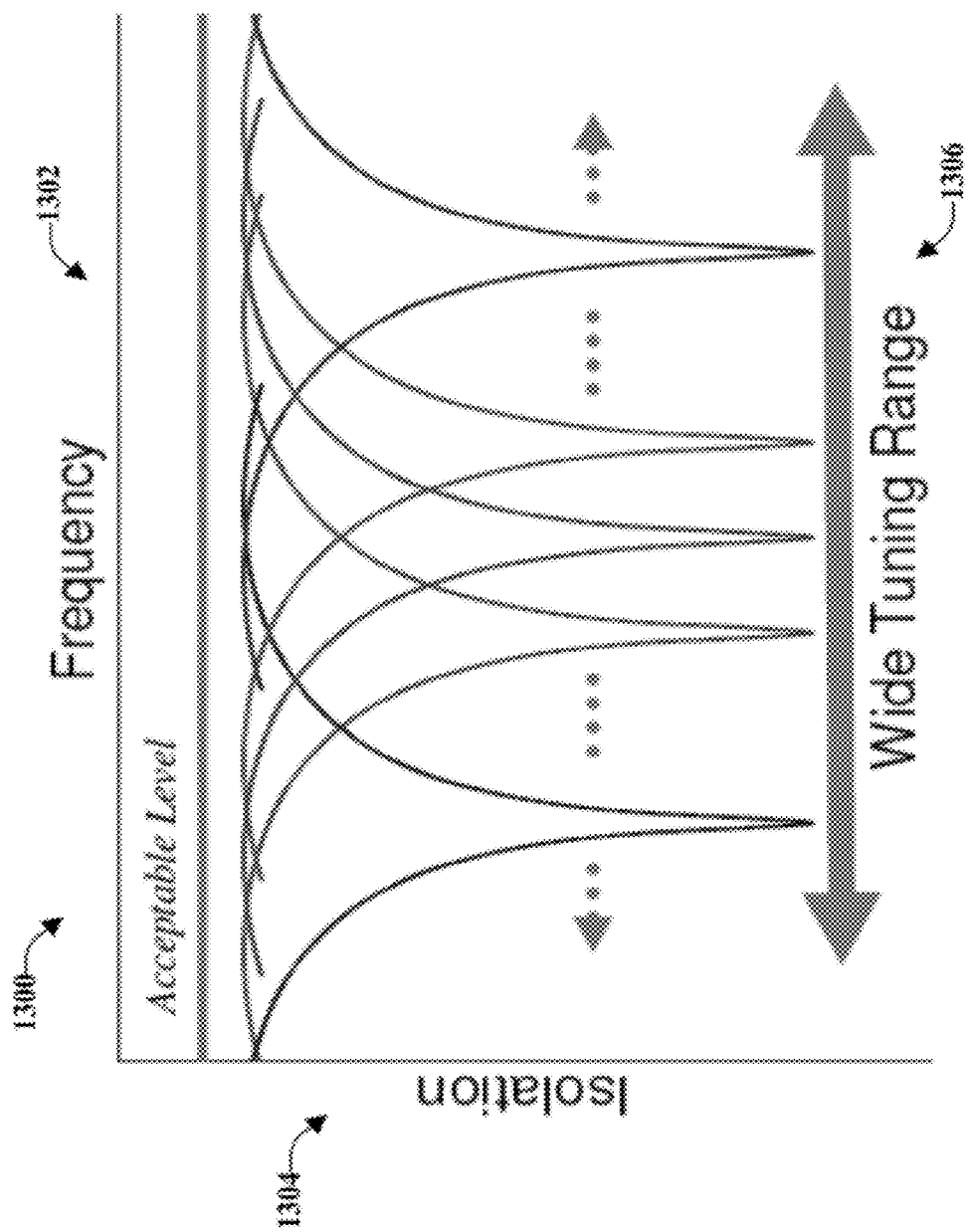
FIG. 13 is a chart showing a wide tuning range that can be achieved with the disclosed aspects.

According to the disclosed aspects, there is tunable isolation enhancement between Port 1 and Port 3 of the wideband active quasi-circulators disclosed herein. Such tunable isolation can be achieved by different gate voltage combinations of each single state distributed amplifier. Further, return loss and gain can remain unchanged. There can also be isolation (or substantial isolation) between transmit and receive parts. In accordance with one or more of the disclosed aspects, a wide tuning range can be achieved, as illustrated by the chart 1300 of FIG. 13. Frequency 1302 is represented along the horizontal axis and isolation 1304 is represented along the vertical axis. The wide tuning range 1306 can be achieved with the combined wideband and tunable properties of the various aspect disclosed herein. As compared to the chart 200 of FIG. 2, the disclosed aspects provide a much wider tuning range than can be achieved with conventional circulators.

In view of exemplary systems and devices shown and described above, methods that may be implemented in accordance with the disclosed subject matter, will be better appreciated with reference to various flow charts. While, for purposes of simplicity of explanation, methods are shown and described as a series of blocks, it is to be understood and appreciated that the claimed subject matter is not limited by the number or order of blocks, as some blocks may occur in different orders and/or at substantially the same time with other blocks from what is depicted and described herein. Moreover, not all illustrated blocks may be required to implement methods described herein. It is to be appreciated that functionality associated with blocks may be implemented by software, hardware, a combination thereof or any other suitable means (e.g. device, system, process, component). Additionally, it can be further appreciated that methods disclosed throughout this specification are capable of being stored on an article of manufacture to facilitate transporting and transferring such methods to various devices. Those skilled in the art will understand and appreciate that a method could alternatively be represented as a series of interrelated states or events, such as in a state diagram.

Figure 14:
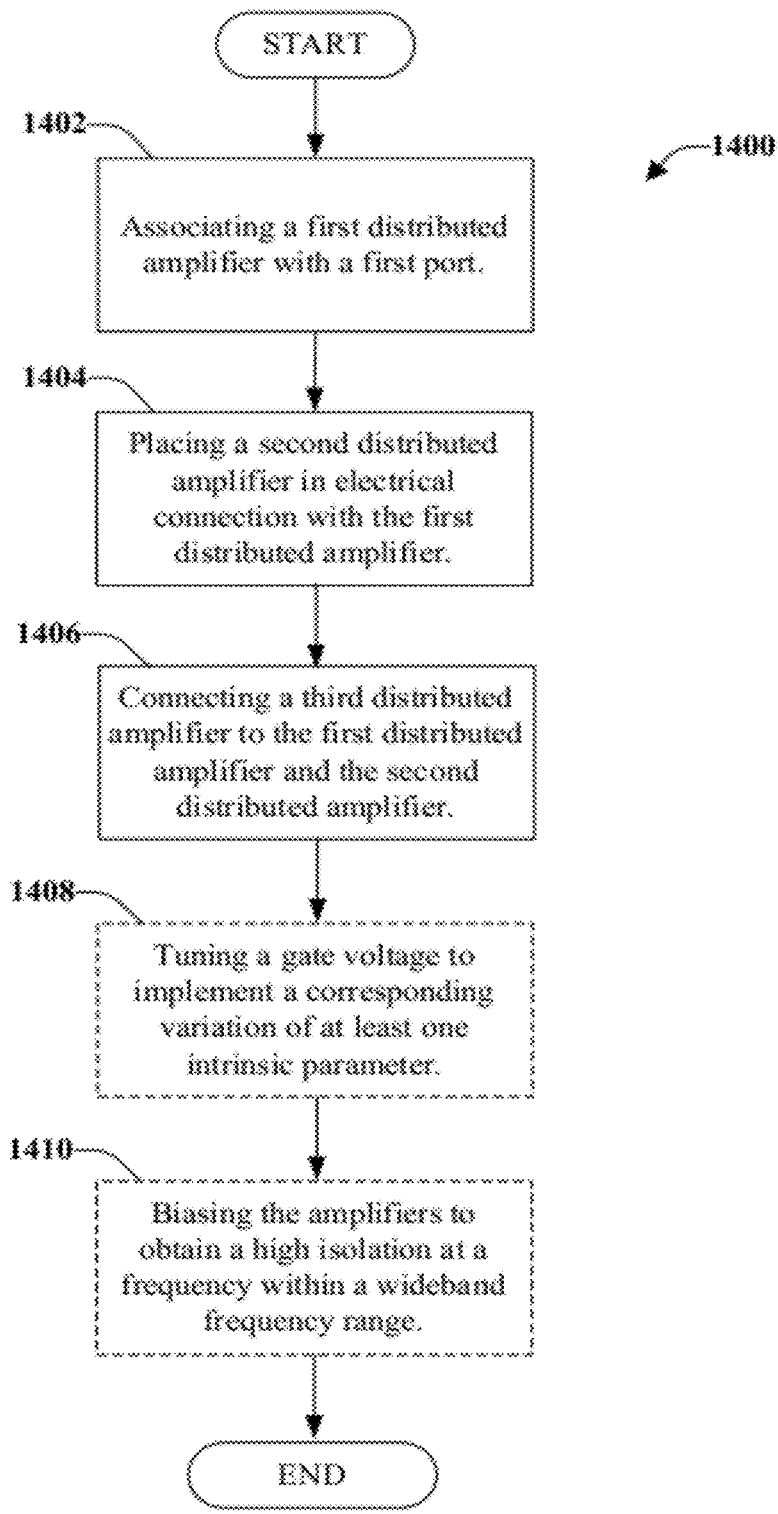
FIG. 14 illustrates a method for manufacturing a wideband active quasi-circulator, according to an aspect.

FIG. 14 illustrates a method 1400 for manufacturing a wideband active quasi-circulator, according to an aspect. Method 1400 starts, at 1402, when a first distributed amplifier is associated with a first port. The first distributed amplifier can provide a wideband signal cancellation. At 1404, a second distributed amplifier is placed in electrical connection with the first distributed amplifier. In some aspects, the placing comprises configuring the second distributed amplifier as a wideband power amplifier.

At 1406, a third distributed amplifier is connected to the first distributed amplifier and the second distributed amplifier. In some aspects, the connecting comprises configuring the third distributed amplifier as a wideband low noise amplifier. The third distributed amplifier comprises a second port and a third port. Electrical signals arriving at the first port propagate along a first path or a second path to the third port. In some aspects, the electrical signals comprise transmit signals and receive signals that are received at the first port at about the same time and propagate along the first path or the second path to the third port.

In accordance with some aspects, method 1400 optionally comprises tuning a gate voltage, at 1408, to implement a corresponding variation of at least one intrinsic parameter. The at least one intrinsic parameter comprises at least one of a gate channel parasitic reactance, a drain channel parasitic reactance, a transconductance, a time constant, a gate channel image impendence, a drain channel image impedance, a gain error, or a phase error.

According to other aspects, method 1400 optionally comprises biasing, at 1410, the first distributed amplifier, the second distributed amplifier, and the third distributed amplifier. The biasing can be utilized to obtain isolation or substantial isolation at a frequency within a wideband frequency range.

Figure 15:
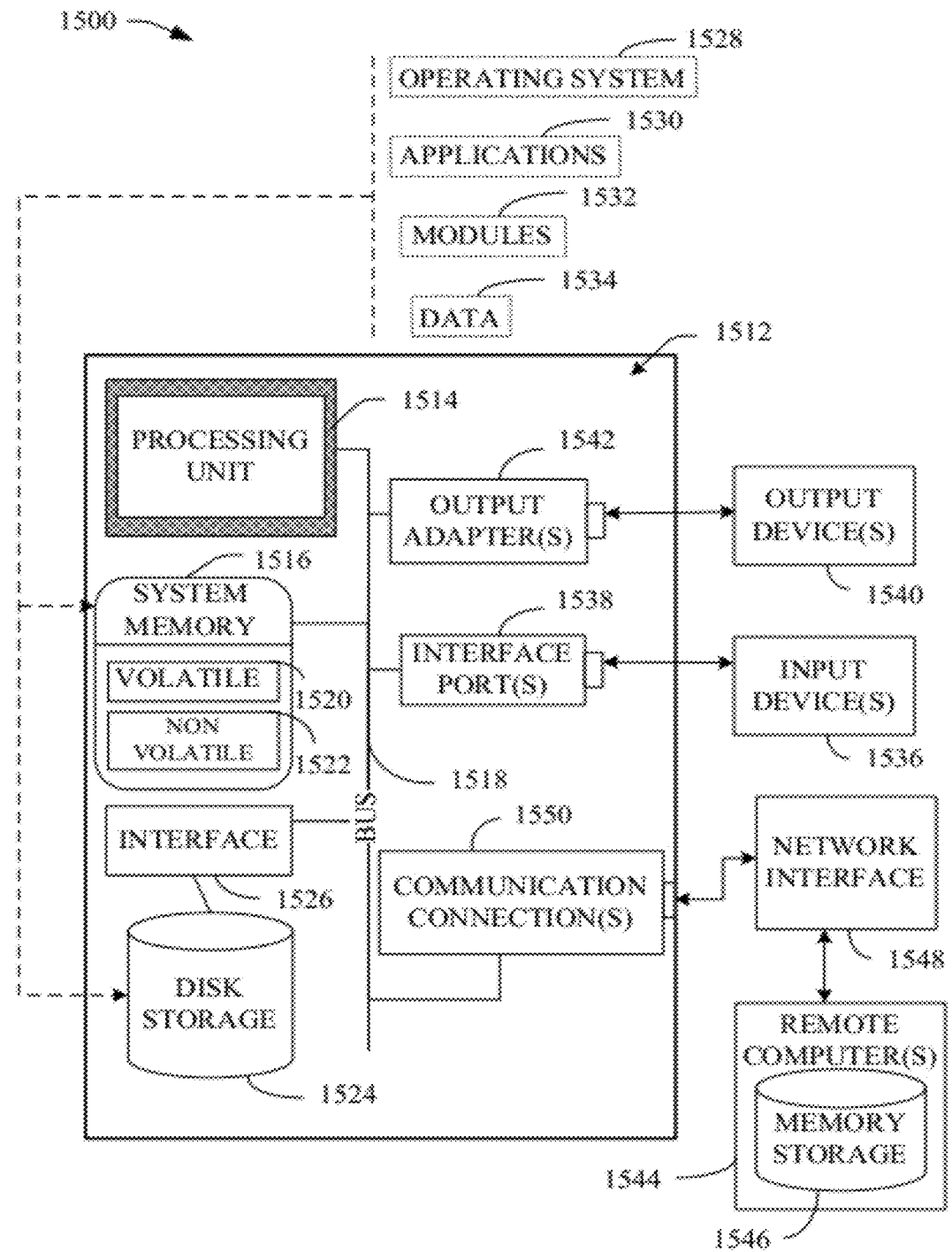
FIG. 15 is a schematic block diagram illustrating a suitable operating environment.
Figure 16:
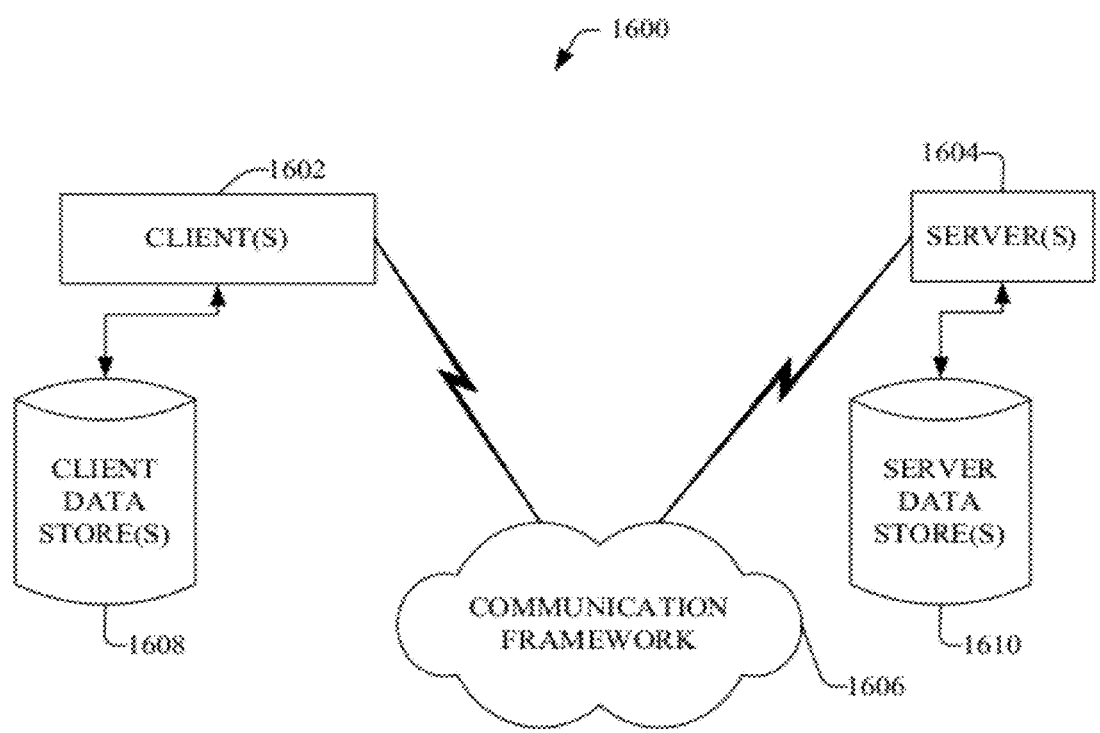
FIG. 16 is a schematic block diagram of a sample-computing environment.

In order to provide a context for the various aspects of the disclosed subject matter, FIGS. 15 and 16 as well as the following discussion are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the subject disclosure also may be implemented in combination with other program modules. Generally, program modules include routines, programs, components, data structures, etc. that perform particular tasks and/or implement particular abstract data types. Moreover, those skilled in the art will appreciate that the disclosed methods may be practiced with other computer system configurations, including single-processor or multiprocessor computer systems, mini-computing devices, mainframe computers, as well as personal computers, hand-held computing devices (e.g., personal digital assistant (PDA), phone), microprocessor-based or programmable consumer or industrial electronics, and the like. The illustrated aspects may also be practiced in distributed computing environments where tasks are performed by remote processing devices that are linked through a communications network. However, some, if not all aspects of the subject disclosure can be practiced on stand-alone computers. In a distributed computing environment, program modules may be located in both local and remote memory storage devices.

With reference to FIG. 15, a suitable environment 1500 for implementing various aspects of the claimed subject matter includes a computer 1512. The computer 1512 includes a processing unit 1514, a system memory 1516, and a system bus 1518. The system bus 1518 couples system components including, but not limited to, the system memory 1516 to the processing unit 1514. The processing unit 1514 can be any of various available processors. Dual microprocessors and other multiprocessor architectures also can be employed as the processing unit 1514.

The system bus 1518 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 1516 includes volatile memory 1520 and nonvolatile memory 1522. The basic input/output system (BIOS), containing the basic routines to transfer information between elements within the computer 1512, such as during start-up, is stored in nonvolatile memory 1522. By way of illustration, and not limitation, nonvolatile memory 1522 can include read only memory (ROM), programmable ROM (PROM), electrically programmable ROM (EPROM), electrically erasable programmable ROM (EEPROM), or flash memory. Volatile memory 1520 includes random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1512 also includes removable/non-removable, volatile/non-volatile computer storage media. FIG. 15 illustrates, for example, a disk storage 1524. Disk storage 1524 includes, but is not limited to, devices such as a magnetic disk drive, floppy disk drive, tape drive, Jaz drive, Zip drive, LS-100 drive, flash memory card, or memory stick. In addition, disk storage 1524 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1524 to the system bus 1518, a removable or non-removable interface is typically used, such as interface 1526).

It is to be appreciated that FIG. 15 describes software that acts as an intermediary between users and the basic computer resources described in the suitable operating environment 1500. Such software includes an operating system 1528. Operating system 1528, which can be stored on disk storage 1524, acts to control and allocate resources of the computer system 1512. System applications 1530 take advantage of the management of resources by operating system 1528 through program modules 1532 and program data 1534 stored either in system memory 1516 or on disk storage 1524. It is to be appreciated that the claimed subject matter can be implemented with various operating systems or combinations of operating systems.

A user enters commands or information into the computer 1512 through input device(s) 1536. Input devices 1536 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1514 through the system bus 1518 via interface port(s) 1538. Interface port(s) 1538 include, for example, a serial port, a parallel port, a game port, and a universal serial bus (USB). Output device(s) 1540 use some of the same type of ports as input device(s) 1536. Thus, for example, a USB port may be used to provide input to computer 1512, and to output information from computer 1512 to an output device 1540. Output adapter 1542 is provided to illustrate that there are some output devices 1540 such as monitors, speakers, and printers, among other output devices 1540, which require special adapters. The output adapters 1542 include, by way of illustration and not limitation, video and sound cards that provide a means of connection between the output device 1540 and the system bus 1518. It is noted that other devices and/or systems of devices provide both input and output capabilities such as remote computer(s) 1544.

Computer 1512 can operate in a networked environment using logical connections to one or more remote computers, such as remote computer(s) 1544. The remote computer(s) 1544 can be a personal computer, a server, a router, a network PC, a workstation, a microprocessor based appliance, a peer device or other common network node and the like, and typically includes many or all of the elements described relative to computer 1512. For purposes of brevity, only a memory storage device 1546 is illustrated with remote computer(s) 1544. Remote computer(s) 1544 is logically connected to computer 1512 through a network interface 1548 and then physically connected via communication connection 1550. Network interface 1548 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1550 refers to the hardware/software employed to connect the network interface 1548 to the bus 1518. While communication connection 1550 is shown for illustrative clarity inside computer 1512, it can also be external to computer 1512. The hardware/software necessary for connection to the network interface 1548 includes, for exemplary purposes only, internal and external technologies such as, modems including regular telephone grade modems, cable modems and DSL modems, ISDN adapters, and Ethernet cards.

FIG. 16 is a schematic block diagram of a sample-computing environment 1600 with which the subject disclosure can interact. The system 1600 includes one or more client(s) 1602. The client(s) 1602 can be hardware and/or software (e.g., threads, processes, computing devices). The system 1600 also includes one or more server(s) 1604. Thus, system 1600 can correspond to a two-tier client server model or a multi-tier model (e.g., client, middle tier server, data server), amongst other models. The server(s) 1604 can also be hardware and/or software (e.g., threads, processes, computing devices). The servers 1604 can house threads to perform transformations by employing the subject disclosure, for example. One possible communication between a client 1602 and a server 1604 may be in the form of a data packet transmitted between two or more computer processes.

The system 1600 includes a communication framework 1606 that can be employed to facilitate communications between the client(s) 1602 and the server(s) 1604. The client (s) 1602 are operatively connected to one or more client data store(s) 1608 that can be employed to store information local to the client(s) 1602. Similarly, the server(s) 1604 are operatively connected to one or more server data store(s) 1610 that can be employed to store information local to the servers 1604.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled.

An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It is also noted, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

In the subject specification and annexed drawings, terms such as "store," "data store," "data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can include both volatile and nonvolatile memory.

By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and dire Rambus RAM (DRRAM). Additionally, the disclosed memory components of systems or methods herein are intended to comprise, without being limited to comprising, these and any other suitable types of memory.

Various aspects or features described herein can be implemented as a method, apparatus, or article of manufacture using standard programming and/or engineering techniques. In addition, various aspects disclosed in the subject specification can also be implemented through program modules stored in a memory and executed by a processor, or other combination of hardware and software, or hardware and firmware.

Computing devices typically include a variety of media, which can include computer-readable storage media or communications media, which two terms are used herein differently from one another as follows.

Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

What has been described above includes examples of systems and methods that provide advantages of the subject aspects. It is, of course, not possible to describe every conceivable combination of components or methods for purposes of describing the subject aspects, but one of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

As used in this application, the terms "component," "system," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration, both an application running on a server or network controller, and the server or network controller can be a component. One or more components may reside within a process and/or thread of execution and a component may be localized on one computer and/or distributed between two or more computers. Also, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software, or firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that confers at least in part the functionality of the electronic components. As further yet another example, interface(s) can include input/output (I/O) components as well as associated processor, application, or Application Programming Interface (API) components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings are generally be construed to mean "one or more" unless specified otherwise or clear from context to be directed to a singular form.

What is claimed is:

1. A wideband active quasi-circulator, comprising:
a first distributed amplifier connected to a first port and configured for wideband signal cancellation;
a second distributed amplifier configured as a wideband power amplifier and operatively connected to the first distributed amplifier; and
a third distributed amplifier configured as a wideband low noise amplifier and operatively connected to the first distributed amplifier, the second distributed amplifier, a second port, and a third port.

2. The wideband active quasi-circulator of claim 1, further comprising an antenna configured for simultaneous signal transmission and signal reception when the first distributed amplifier, the second distributed amplifier, and the third distributed amplifier are biased.

3. The wideband active quasi-circulator of claim 1, wherein the second distributed amplifier and the third distributed amplifier are configured to provide wideband frequency operation.

4. The wideband active quasi-circulator of claim 1, wherein, at a first frequency, the wideband power amplifier is isolated or substantially isolated from the wideband low noise amplifier.

5. The wideband active quasi-circulator of claim 1, wherein the first port is a single antenna port, and wherein the single antenna port, the wideband power amplifier, and the wideband low noise amplifier are configured for simultaneous transmission and reception of a signal.

6. The wideband active quasi-circulator of claim 1, wherein the wideband active quasi-circulator is configured to operate in a wideband frequency range as a function of a cut-off frequency.

7. The wideband active quasi-circulator of claim 6, wherein the wideband active quasi-circulator is tunable, as a function of biasing the first distributed amplifier, the second distributed amplifier, and the third distributed amplifier, to an isolation enhancement between the wideband power amplifier and the wideband low noise amplifier at a frequency within the wideband frequency range.

8. The wideband active quasi-circulator of claim 1, wherein the wideband active quasi-circulator is configured to perform wideband transmission and reception as a function of a topology of the first distributed amplifier, the second distributed amplifier, and the third distributed amplifier.

9. The wideband active quasi-circulator of claim 1, wherein the wideband active quasi-circulator is configured to operate in a wideband isolation between transmission and reception as a function of the wideband signal cancellation of the third distributed amplifier.

10. The wideband active quasi-circulator of claim 1, wherein the wideband power amplifier comprises a distributed power amplifier.

11. The wideband active quasi-circulator of claim 1, wherein the wideband low noise amplifier comprises a distributed low noise amplifier.

12. The wideband active quasi-circulator of claim 1, wherein the first distributed amplifier, the second distributed amplifier, and the third distributed amplifier comprise a different gate voltage combination to provide tunable isolation.

13. A method, comprising:
associating a first distributed amplifier with a first port, wherein the first distributed amplifier provides wideband signal cancellation;
electrically connecting a second distributed amplifier with the first distributed amplifier, wherein the second distributed amplifier is configured as a wideband power amplifier; and
connecting a third distributed amplifier to the first distributed amplifier and the second distributed amplifier, wherein the third distributed amplifier is connected to a second port and a third port, and wherein electrical signals arriving at the first port propagate along a first path or a second path to the third port.

14. The method of claim 13, wherein the connecting the third distributed amplifier comprises configuring the third distributed amplifier as a wideband low noise amplifier.

15. The method of claim 13, wherein the electrical signals comprise transmit signals and receive signals that are received at the first port at about the same time and propagate along the first path or the second path to the third port.

16. The method of claim 13, further comprising:
tuning a gate voltage to implement a corresponding variation of at least one intrinsic parameter, wherein the at least one intrinsic parameter comprises a gate channel parasitic reactance, a drain channel parasitic reactance, a transconductance, a time constant, a gate channel image impendence, a drain channel image impedance, a gain error, or a phase error, or combinations thereof.

17. The method of claim 13, further comprising:
biasing the first distributed amplifier, the second distributed amplifier, and the third distributed amplifier to obtain isolation or substantial isolation at a frequency within a wideband frequency range.

18. A system, comprising:
means for providing wideband signal cancellation;
means for supplying wideband power amplification;
means for obtaining wideband low noise amplification, wherein the means for providing, the means for supplying, and the means for obtaining are electrically coupled; and
means for altering gate voltage combinations of the means for providing, the means for supplying, and the means for obtaining for tunable isolation enhancement.

19. The system of claim 18, further comprising means for simultaneously transmitting and receiving signals to separate transmit and receive path signals.

* * * * *